United States Patent
Namkoong et al.

(10) Patent No.: US 9,774,315 B2
(45) Date of Patent: Sep. 26, 2017

(54) METHOD FOR INCREASING ACTIVE INDUCTOR OPERATING RANGE AND PEAKING GAIN

(71) Applicant: Xilinx, Inc., San Jose, CA (US)

(72) Inventors: Jinyung Namkoong, San Jose (CA); Wenfeng Zhang, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/933,346

(22) Filed: Nov. 5, 2015

(65) Prior Publication Data

US 2017/0134009 A1    May 11, 2017

(51) Int. Cl.
*H03K 17/16* (2006.01)
*H03K 3/01* (2006.01)

(52) U.S. Cl.
CPC ..................................... *H03K 3/01* (2013.01)

(58) Field of Classification Search
CPC .............................. H03K 3/01; H04L 25/0298
USPC .......................................................... 326/30
See application file for complete search history.

(56) References Cited

U.S. PATENT DOCUMENTS

| | | | | |
|---|---|---|---|---|
| 6,084,470 A * | 7/2000 | Shiramatsu | ........ | H03H 11/0422 330/252 |
| 6,114,907 A * | 9/2000 | Sakurai | ............... | H03F 3/45076 330/253 |
| 6,236,524 B1 * | 5/2001 | Gregoire | ................ | G11B 5/012 330/261 |
| 6,346,804 B2 * | 2/2002 | Ueno | ............................ | 323/280 |
| 6,377,095 B1 * | 4/2002 | Kuo | ........................ | H03K 5/133 327/112 |
| 6,559,723 B2 * | 5/2003 | Hollenbeck | ............. | H03F 3/193 327/318 |
| 6,566,961 B2 * | 5/2003 | Dasgupta | ............ | H03F 3/45183 330/253 |

(Continued)

FOREIGN PATENT DOCUMENTS

CN         103633940         3/2014

OTHER PUBLICATIONS

Kimura, "28Gb/s 560mW Multi-Standard SerDes with Single-Stage Analog Front-End and 14-Tap Decision-Feedback Equalizer in 28nm CMOS," 2014 IEEE International Solid-State Circuits Conference Digest of Technical Papers, Feb. 9, 2014, pp. 38-39, IEEE, Piscataway, New Jersey, USA.

(Continued)

*Primary Examiner* — Kenneth B Wells
(74) *Attorney, Agent, or Firm* — Steven Roberts

(57) ABSTRACT

Methods and apparatus are described for a differential active inductor load for inductive peaking in which cross-coupled capacitive elements are used to cancel out, or at least reduce, the limiting effect of the gate-to-drain capacitance ($C_{gd}$) of transistors in the active inductor load. The cross-coupled capacitive elements extend the range over which the active inductor load behaves inductively and increase the quality factor (Q) of each active inductor. Therefore, the achievable inductive peaking of the load is significantly increased, which leads to providing larger signal swing across the load for a given power or, alternatively, lower power for a given signal swing.

20 Claims, 6 Drawing Sheets

(56) References Cited

U.S. PATENT DOCUMENTS

| | | | |
|---|---|---|---|
| 6,978,125 B2* | 12/2005 | Lindell | H03J 3/08 455/183.1 |
| 7,042,384 B2* | 5/2006 | Shimizu | H03M 1/0602 341/155 |
| 7,145,928 B1* | 12/2006 | Maxim | G02F 1/0123 372/38.01 |
| 7,180,370 B2* | 2/2007 | Forbes | H03F 1/08 330/253 |
| 7,279,980 B2* | 10/2007 | Heydari | H03F 3/604 330/286 |
| 7,285,987 B2* | 10/2007 | Chung | H03K 19/0948 326/104 |
| 7,403,071 B2* | 7/2008 | Hollenbeck | H03F 3/191 330/254 |
| 7,560,957 B2* | 7/2009 | Chen | H03K 19/09432 326/112 |
| 7,598,811 B2* | 10/2009 | Cao | H03F 3/45183 330/254 |
| 7,679,468 B1* | 3/2010 | Groe | H03C 3/0925 331/23 |
| 8,471,302 B2* | 6/2013 | Akhtar | H01L 27/0629 257/213 |
| 8,698,532 B2* | 4/2014 | Raghavan | H03K 3/012 327/108 |
| 9,246,456 B2* | 1/2016 | Belmas | H03F 3/193 |
| 9,385,769 B2* | 7/2016 | Elzeftawi | H04B 1/163 |
| 2007/0018694 A1 | 1/2007 | Chen et al. | |
| 2015/0303897 A1 | 10/2015 | Lin et al. | |

OTHER PUBLICATIONS

Dickson, Timothy O. et al., "A 1.8-pJ/bit 16×16-Gb/s Source Synchronous Parallel Interface in 32nm SOI CMOS with Receiver Redundancy for Link Recalibration," Proc. of the 2015 IEEE Integrated Circuits Conference, Sep. 28, 2015, pp. 1-4, IEEE, Piscataway, New Jersey, USA.

* cited by examiner

METHOD FOR INCREASING ACTIVE INDUCTOR OPERATING RANGE AND PEAKING GAIN

TECHNICAL FIELD

Examples of the present disclosure generally relate to electronic circuits and, more particularly, to active inductors.

BACKGROUND

Integrated circuits (ICs) may be implemented to perform specified functions. One type of IC is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, dock managers, delay lock loops (DLLs), and so forth. Another type of programmable IC is the complex programmable logic device, or CPLD, A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application specific integrated circuits (ASICs).

These and other types of programmable ICs may be capable of distributing high-speed dock signals by buffering (or otherwise driving) and routing these signals throughout the programmable IC. The signal nets used for distributing the clock signals may be terminated with particular loads.

SUMMARY

One example of the present disclosure is an active inductor load. The active inductor load generally includes a pair of active inductors, each active inductor comprising a transistor and a resistor electrically coupled to the transistor, and a pair of cross-coupled capacitive elements electrically coupled to the pair of active inductors.

Another example of the present disclosure is a method of distributing a differential periodic signal. The method generally includes driving the differential periodic signal on a signal net pair and loading the differential periodic signal with an active inductor load configured to exhibit inductive peaking in a frequency band comprising at least a frequency of the differential periodic signal. The active inductor load includes a pair of active inductors, each active inductor comprising a transistor and a resistor electrically coupled to the transistor, and a pair of cross-coupled capacitive elements electrically coupled to the pair of active inductors.

Yet another example of the present disclosure is an apparatus for distributing a differential periodic signal. The apparatus generally includes means for driving the differential periodic signal on a signal net pair and means for loading the differential periodic signal with inductive peaking in a frequency band comprising at least a frequency of the differential periodic signal. The means for loading includes a pair of active inductors, each active inductor comprising a transistor and a resistor electrically coupled to the transistor, and a pair of cross-coupled capacitive elements electrically coupled to the pair of active inductors.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

DETAILED DESCRIPTION

Examples of the present disclosure provide a differential active inductor load for inductive peaking in which cross-coupled capacitive elements are used to cancel out, or at least reduce, the limiting effect of the gate-to-drain capacitance ($C_{gd}$) of transistors in the active inductor load. The cross-coupled capacitive elements extend the range over which the active inductor load behaves inductively and increase the quality factor (Q) of each active inductor. Therefore, the achievable inductive peaking of the load is significantly increased, which leads to providing larger signal swing across the load for a given power or, alternatively, lower power for a given signal swing.

Example Programmable Device Architecture

Figure 1:
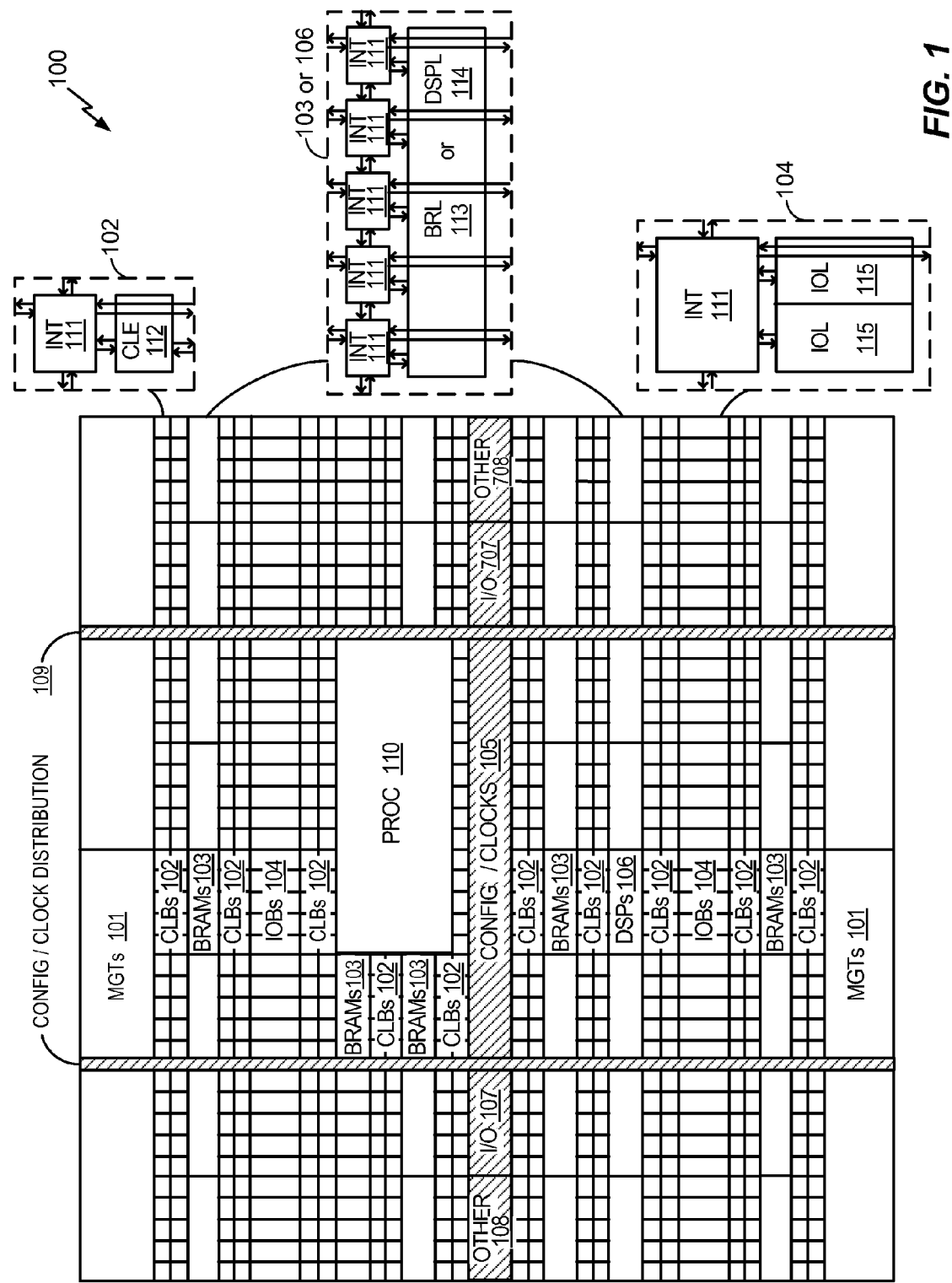
FIG. 1 is a block diagram illustrating an example architecture for a programmable device.

FIG. 1 is a block diagram illustrating an example architecture 100 for a programmable device, in accordance with an example of the present disclosure. The architecture 100 may be implemented within a field programmable gate array (FPGA), for example. As shown, the architecture 100 includes several different types of programmable circuitry, e.g., logic, blocks. For example, the architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing (DSP) blocks 106, specialized I/O blocks 107 (e.g., configuration ports and clock ports), and other programmable logic 108, such as digital clock managers, analog-to-digital converters (ADCs), system monitoring logic, and the like.

In some FPGAs, each programmable tile includes a programmable interconnect element (INT) 111 having standardized connections to and from a corresponding INT 111 in each adjacent tile. Therefore, the INTs 111, taken together, implement the programmable interconnect structure for the illustrated FPGA. Each INT 111 also includes the connections to and from the programmable logic element within the same tile, as shown by the examples included at the far right of FIG. 1.

For example, a CLB 102 may include a configurable logic element (CLE) 112 that can be programmed to implement user logic plus a single INT 111. A BRAM 103 may include a BRAM logic element (BRL) 113 in addition to one or more INTs 111. Typically, the number of INTs 111 included in a tile depends on the width of the tile. In the pictured example, a BRAM tile has the same width as five CLBs, but other numbers (e.g., four) can also be used. A DSP block 106 may include a DSP logic element (DSPL) 114 in addition to an appropriate number of INTs 111. An 10B 104 may include, for example, two instances of an I/O logic element (IOL) 115 in addition to one instance of an INT 111. As will be clear to a person having ordinary skill in the art, the actual I/O pads connected, for example, to the IOL 115 typically are not confined to the area of the IOL 115.

In the example architecture 100 depicted in FIG. 1, a horizontal area near the center of the die (shown shaded in FIG. 1) is used for configuration, clock, and other control logic (CONFIG/CLOCKS 105). Other vertical areas 109 extending from this central area may be used to distribute the clocks and configuration signals across the breadth of the FPGA.

Some FPGAs utilizing the architecture 100 illustrated in FIG. 1 include additional logic blocks that disrupt the regular row structure making up a large part of the FPGA. The additional logic blocks may be programmable blocks and/or dedicated circuitry. For example, a processor block depicted as PROC 110 spans several rows of CLBs 102 and BRAMs 103.

The PROC 110 may be implemented as a hard-wired processor that is fabricated as part of the die that implements the programmable circuitry of the FPGA. The PROC 110 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 110 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein) as well as the interconnect circuitry that selectively couples the various circuit blocks, tiles, and/or elements according to configuration data that is loaded into the FPGA. For example, portions shown in FIG. 1 that are external to the PROC 110 may be considered part of the, or the, programmable circuitry of the FPGA.

FIG. 1 is intended to illustrate an example architecture 100 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 1 are exemplary. In an actual FPGA, for example, more than one adjacent row of CLBs 102 is typically included wherever the CLBs appear, in an effort to facilitate the efficient implementation of a user circuit design. The number of adjacent CLB rows, however, can vary with the overall size of the FPGA. Further, the size and/or positioning of the PROC 110 within the FPGA is for purposes of illustration only and is not intended as a limitation of the one or more examples of the present disclosure.

As described above, periodic signals (e.g., clock signals) may be driven and routed through the configuration, clock, and other control logic (CONFIG/CLOCKS 105) and/or the vertical areas 109 to distribute the periodic signals throughout the FPGA. The signal nets used for distributing the periodic signals may be terminated with active inductor loads, as described below.

Example Active Inductor Load

Figure 2A:
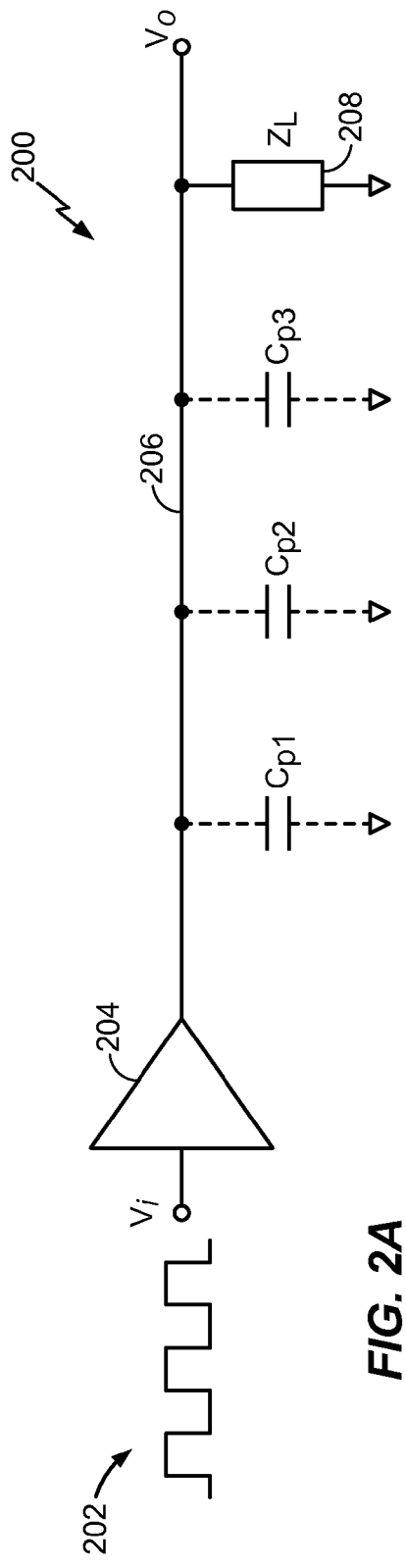
FIG. 2A is a conceptual diagram of an example single-ended buffer driving a signal net terminated with a load, in accordance with an example of the present disclosure.

FIG. 2A is a conceptual diagram of an example circuit 200 for distributing a periodic signal 202, such as a clock signal in a programmable IC. The circuit 200 includes a single-ended buffer 204, which receives the periodic signal 202. For some examples, the buffer 204 may be implemented with current mode logic (CML). Also known as source-coupled logic (SCL), CML is a high-speed differential digital logic family whose speed is mainly due to a lower output voltage swing compared to static complementary metal-oxide semiconductor (CMOS) circuits, as well as very fast current switching taking place at the input differential pair transistors.

The output of the single-ended buffer 204 may drive a signal net 206, which may be terminated with a load 208 having impedance $Z_L$. Although the signal net 206 is illustrated in FIG. 2A as being terminated at the far end (the destination end) of the signal net 206 by the load 208, the load may also terminate the signal net at the near end (the source end) or any other suitable location along the signal net. When implemented with contemporary layout techniques, such as microstrip, a relatively long signal net 206 may be considered as having various parasitic capacitors (e.g., $C_{p1}$, $C_{p1}$, and $C_{p3}$) distributed along its length, which may be considered part of the load 208. If the load 208 is implemented with a resistor, for example, the bandwidth of the circuit 200 may be limited by the resistance R of the resistor and the lumped capacitance C (e.g., the sum of the parasitic capacitances for $C_{p1}$, $C_{p1}$, and $C_{p3}$ and any input capacitance of the destination, such as another buffer) as 1/RC. For a given larger lumped capacitance C, a smaller resistance R may be indicated to obtain a high bandwidth. However, small load resistance R translates to higher current (I) from the buffer 204 to maintain a certain signal amplitude since the signal swing is I*R.

Figure 2B:
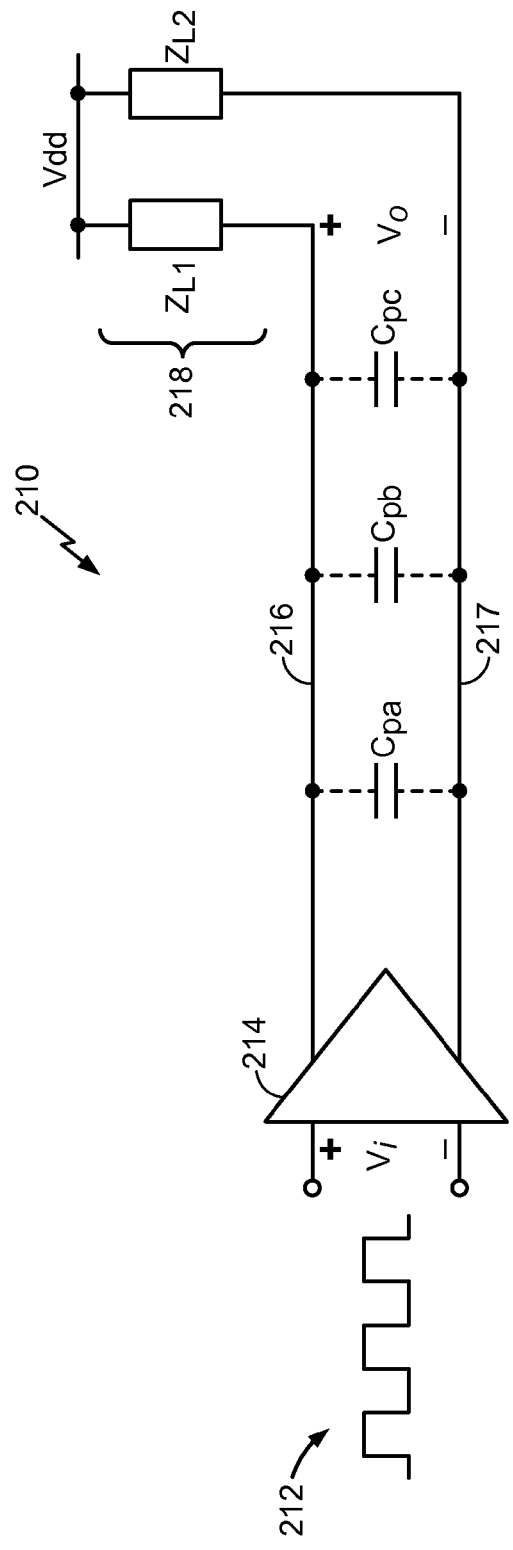
FIG. 2B is a conceptual diagram of an example differential buffer driving a signal net pair terminated with a differential load, in accordance with an example of the present disclosure.

FIG. 2B is a conceptual diagram of an example circuit 210 for distributing a differential periodic signal 212, such as a differential clock signal in a programmable IC. The circuit 200 includes a differential buffer 214, which may be implemented as a differential CML buffer. The output of the differential buffer 214 may drive a differential signal net pair (comprising signal nets 216 and 217), which may be terminated with a differential load 218 having impedances $Z_{L1}$ and $Z_{L2}$. While the differential signal net pair is illustrated in FIG. 2B as being terminated at the far end of the signal net pair by the differential load 218, the load may also terminate the signal net pair at the near end or any other suitable location along the signal net pair. Although shown as being connected to a power supply voltage rail (e.g., Vdd) in FIG. 2B, the differential load 218 may be connected instead to any suitable reference potential, such as electrical ground.

Similar to the signal net 206 in FIG. 2A, the relatively long signal net pair in FIG. 2B may be considered as having various parasitic capacitors (e.g., $C_{pa}$, $C_{pb}$, and $C_{pc}$) distributed along the length thereof. If the differential load 218 is implemented with resistors, for example, the bandwidth of the circuit 210 may be limited by the resistances of the resistors and the lumped capacitance, as described above. For a given larger lumped capacitance, smaller resistances may be specified to obtain a high bandwidth, which translates to higher currents from the buffer 214 to maintain a particular signal amplitude. Basically for higher bandwidth operation, higher power may be indicated for resistive loads.

Alternatively, to drive a large capacitive signal net and to save power, inductive loads may be utilized to take advantage of inductive peaking. With inductive peaking, the inductance L of the load is designed ideally to cancel out the lumped capacitance of the signal net(s) and destination within a frequency band that includes the frequency of the periodic signal being driven by the buffer. Passive on-chip or off-chip inductors may be used as the inductive loads, but a passive inductor may consume a relatively large area, which may lead to higher cost. Therefore, active inductors may provide suitable alternatives.

As used herein, an "active inductor" generally refers to a configuration of an active device that exhibits inductive behavior over a certain frequency range. The active device may be a p-channel metal-oxide semiconductor (PMOS) or n-channel metal-oxide semiconductor (NMOS) transistor, for example. To act as an inductor, the transistor may have a resistor connected between the gate and the drain of the transistor. Traditional transistor types had device parasitics (e.g., junction capacitance) that limited practical applications of active inductors. However, recently developed transistor types such as fin field-effect transistor (FinFET) offer lower junction capacitance, which makes employing active inductor loads for high-speed clocking circuits more feasible. A FinFET transistor is a multi-gate transistor built on a silicon-on-insulator (SOI) substrate in which the conducting channel is wrapped by a thin silicon "fin," which forms the body of the transistor.

Figure 3:
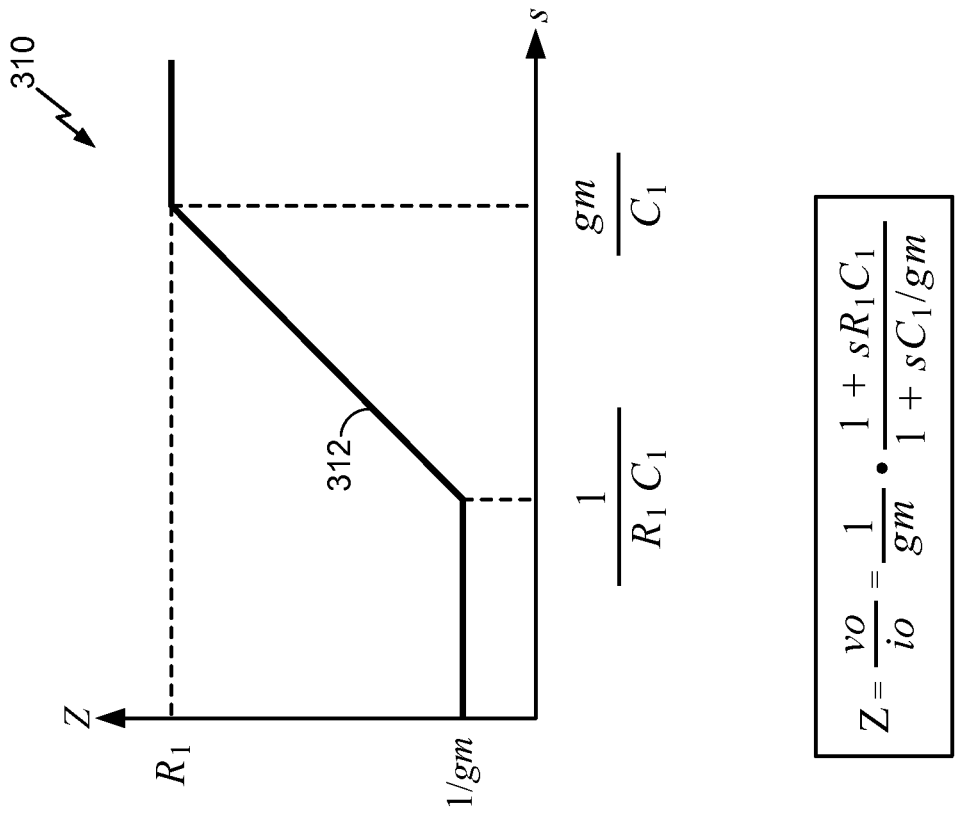
FIG. 3 is a schematic diagram of an example active inductor circuit without the gate-to-source capacitance ($C_{gd}$) and an example frequency response corresponding to this active inductor circuit.
Figure 3:
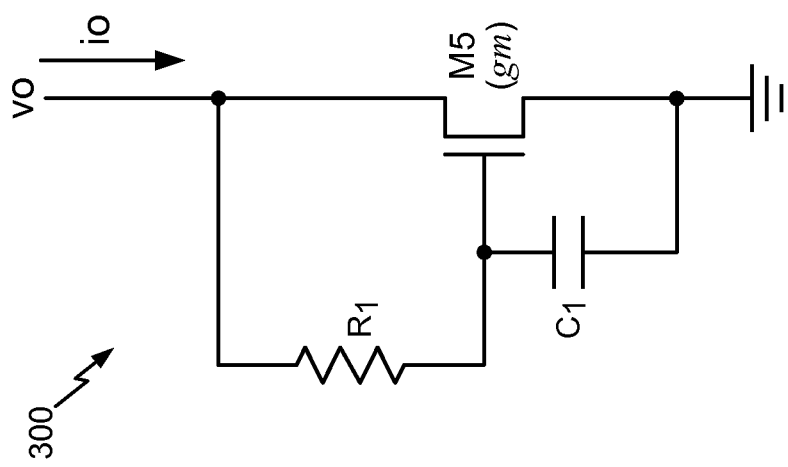

FIG. 3 provides a schematic diagram of an example active inductor circuit 300, implemented as a single-ended NMOS load, which could be used as the load 208 in FIG. 2A, for example. The active inductor circuit 300 includes an NMOS transistor M5 and a resistor R1. The NMOS transistor M5 may have a transconductance gm and an intrinsic gate-to-source capacitance ($C_{gs}$), which is represented by capacitor $C_1$. The resistor R1 may be connected between the drain and the gate of the NMOS transistor M5 as shown.

FIG. 3 also provides an example log-log magnitude plot 310 of impedance (Z) versus frequency (s), illustrating the frequency response 312 corresponding to the active inductor circuit 300. The frequency response 312 is based on the following equation for the impedance (Z) derived by small signal analysis:

$$Z = \frac{vo}{io} = \frac{1}{gm} \frac{1+sR_1C_1}{1+sC_1/gm}$$

The impedance of the circuit 300 is 1/gm at lower frequencies (below $1/R_1C_1$), but increases linearly to $R_1$ at higher frequencies (above $gm/C_1$). Over the frequency range where the impedance is increasing linearly with frequency, the circuit 300 is behaving as an inductor. Due to gradual rolloff around the bends of the frequency response 312, the circuit 300 is most inductive at frequencies in the middle of the positively sloping ramp. Therefore, it may be desirable to have a large frequency range where Z is increasing. As such, the resistance $R_1$ may be designed to be much larger than the inverse of the transistor's transconductance (1/gm) (e.g., at least ten times greater).

Intuitively, the impedance of the circuit 300 appears inductive for the following reason. If the output voltage (vo) is driven with a sinusoidal signal, the gate voltage of NMOS transistor M5 follows 90° later. As a result, the output current (io) lags vo by 90°. Because the gate voltage swing decreases with increased frequency, io also diminishes with frequency. This 90° lag and decreasing voltage swing are the same properties for an inductor.

The active inductor circuit 300 represents an ideal case, but a real transistor has an intrinsic gate-to-drain capacitance ($C_{gd}$) in addition to $C_{gs}$. $C_{gd}$ may limit the effectiveness of an active inductor circuit and, as such, may be considered as a parasitic capacitance.

Figure 4:
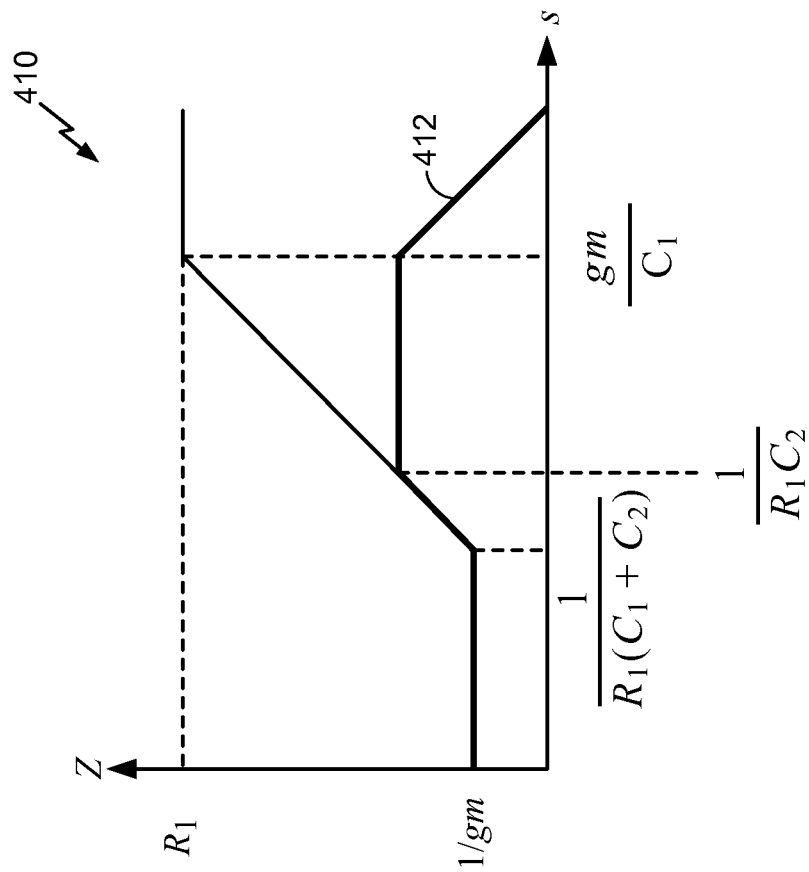
FIG. 4 is a schematic diagram of an example active inductor circuit with $C_{gd}$ and an example frequency response corresponding thereto and illustrating the effects of $C_{gd}$.
Figure 4:
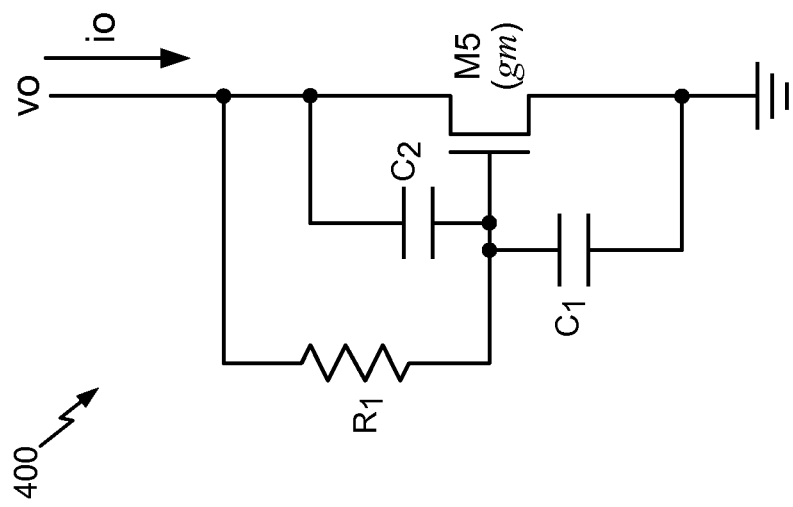

FIG. 4 provides a schematic diagram of an example active inductor circuit 400, adding the intrinsic $C_{gd}$, which is represented by capacitor $C_2$, of the NMOS transistor M5 to the circuit 300 of FIG. 3. FIG. 4 also provides an example log-log magnitude plot 410 of impedance (Z) versus frequency (s), illustrating the frequency response 412 corresponding to the active inductor circuit 400. The frequency response 412 is based on the following equation for the impedance (Z) derived by small signal analysis:

$$Z = \frac{vo}{io} = \frac{1}{gm} \frac{1+sR_1(C_1+C_2)}{(1+sR_1C_2)(1+sC_1/gm)}$$

The addition of $C_2$ introduces an extra pole, significantly reducing the frequency range over which the circuit 400 behaves as an inductor (e.g., only between $1/R_1(C_1+C_2)$ and $1/R_1C_2$). For device parasitics in FinFET technology, C2 is about the same size as C1. As a result, the inductive region for FinFET technology may have an impedance magnitude factor of only about 2, rather than approximately 10 as in the ideal frequency response 312 of FIG. 3. Furthermore, if gradual rolloff around bends of the frequency response 412 are considered, 90° phase shift may most likely not be achieved.

Accordingly, what is needed are techniques and apparatus for overcoming the above limitations of active inductor circuits.

Figure 5A:
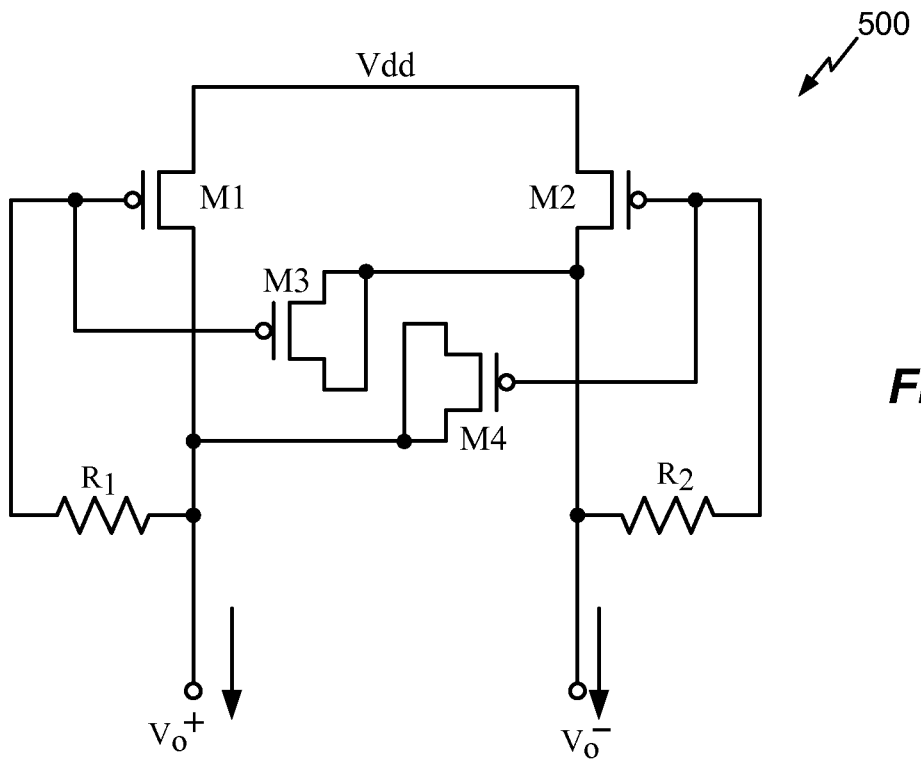
FIG. 5A is a schematic diagram of an example differential active inductor load circuit implemented with p-channel metal-oxide semiconductor (PMOS) transistors and using cross-coupled capacitive elements in an effort to compensate for the effects of $C_{gd}$, in accordance with an example of the present disclosure.

FIG. 5A is a schematic diagram of an example differential active inductor load circuit 500 that cancels out (or at least reduces) the effect of $C_{gd}$ ($C_2$). The circuit 500 is implemented as a differential PMOS load, which may be used as the load 218 in FIG. 2B, for example. The buffer 214, multiplexer (mux), or any of various other suitable driving circuits may be implemented with a differential NMOS transistor pair connected with the differential active inductor load circuit 500 at the output nodes (Vo+ and Vo−).

As illustrated, the circuit 500 includes a differential pair of PMOS transistors M1 and M2, whose drains are connected with the output nodes. Resistors R1 and R2 are connected between the gates and drains of the PMOS transistors M1 and M2, respectively. The sources of the PMOS transistors M1 and M2 are connected with a power supply voltage rail (e.g., Vdd). The intrinsic capacitances $C_{gd}$ and $C_{gs}$ of the PMOS transistors M1 and M2 are present, but are not shown in FIG. 5A.

The active inductor load circuit 500 also includes two cross-coupled capacitive elements in an effort to compensate for the effects of $C_{gd}$. Any of various suitable types of capacitive elements (e.g., capacitors) may be used. In FIG. 5A, the capacitive elements are implemented with PMOS transistors M3 and M4. The drain and source of PMOS transistor M3 may be shorted together, and the drain and source of PMOS transistor M4 may be shorted together. The gate of PMOS transistor M3 may be connected with the gate of PMOS transistor M1, and at least one of the drain or the source of transistor M3 may be connected with the drain of PMOS transistor M2. Likewise, the gate of PMOS transistor M4 may be connected with the gate of PMOS transistor M2, and at least one of the drain or the source of transistor M4 may be connected with the drain of PMOS transistor M1, such that PMOS transistors M3 and M4 are cross-coupled.

By having an extra capacitive element on the gate node of PMOS transistor M1, whose other terminal is connected with a signal net (output node Vo−) that moves in the opposite direction to the drain node of transistor M1 (also output node Vo+), the limiting effect of $C_{gd}$ on transistor M1 may be canceled, or at least reduced. Similarly, by having an extra capacitive element on the gate node of PMOS transistor M2, whose other terminal is connected with a signal net (output node Vo+) that moves complementary to the drain node of transistor M2 (also output node Vo−), the limiting effect of $C_{gd}$ on transistor M2 may be canceled, or at least reduced. The cross-coupled capacitive elements extend the range over which the active inductor load circuit 500 behaves inductively and increase the quality factor (Q) of each active inductor. Therefore, the achievable inductive peaking of the circuit 500 is significantly increased, which leads to providing larger signal swing across the circuit 500 for a given power or, alternatively, lower power for a given signal swing.

For some examples, PMOS transistors M3 and M4 may be the same type and have the same architecture and dimensions as the PMOS transistors M1 and M2. In this manner, the cancellation of the effects of the intrinsic gate-to-drain capacitances may track well across process, voltage, and temperature (PVT).

The cross-coupled capacitive elements may also be applied to a differential active inductor load implemented with NMOS transistors. Such an NMOS differential load may be used, for example, when the buffer 214, multiplexer (mux), or any of various other suitable driving circuits are implemented with a differential PMOS transistor pair.

Figure 5B:
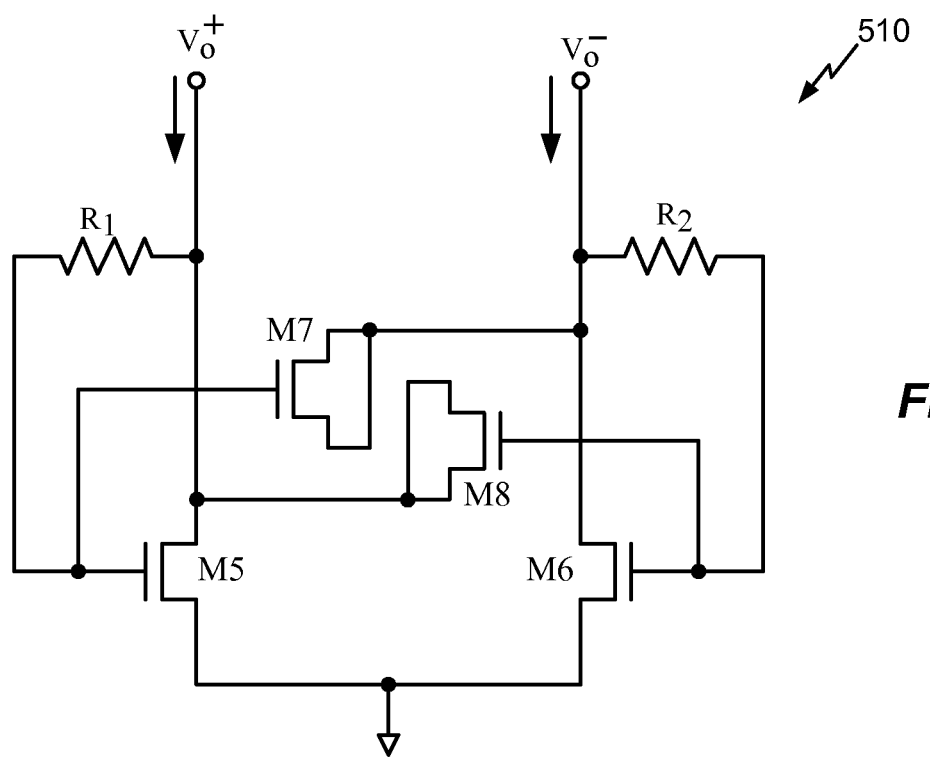
FIG. 5B is a schematic diagram of an example differential active inductor load circuit implemented with n-channel metal-oxide semiconductor (NMOS) transistors and using cross-coupled capacitive elements in an effort to compensate for the effects of $C_{gd}$, in accordance with an example of the present disclosure.

FIG. 5B is a schematic diagram of an example differential active inductor load circuit 510 that cancels out (or at least reduces) the effect of $C_{gd}$ ($C_2$), in accordance with an example of the present disclosure. The circuit 510 includes a differential pair of NMOS transistors M5 and M6, whose drains are connected with the output nodes (Vo+ and Vo−). Resistors R1 and R2 are connected between the gates and drains of the NMOS transistors M5 and M6, respectively. The sources of the NMOS transistors M5 and M6 are connected with a reference potential (e.g., electrical ground). The intrinsic capacitances $C_{gd}$ and $C_{gs}$ of the NMOS transistors M5 and M6 are present, but are not shown in FIG. 5B.

The active inductor load circuit 510 also includes two cross-coupled capacitive elements in an effort to compensate for the effects of $C_{gd}$. Any of various suitable types of capacitive elements (e.g., capacitors) may be used. In FIG. 5B, the capacitive elements are implemented with NMOS transistors M7 and M8. The drain and source of NMOS transistor M7 may be shorted together, and the drain and source of NMOS transistor M8 may be shorted together. The gate of NMOS transistor M7 may be connected with the gate of NMOS transistor M5, and at least one of the drain or the source of transistor M7 may be connected with the drain of NMOS transistor M6. Likewise, the gate of NMOS transistor M8 may be connected with the gate of NMOS transistor M6, and at least one of the drain or the source of transistor M8 may be connected with the drain of NMOS transistor M5, such that PMOS transistors M7 and M8 are cross-coupled.

By having an extra capacitive element on the gate node of NMOS transistor M5, whose other terminal is connected with a signal net (output node Vo−) that moves in the opposite direction to the drain node of transistor M5 (also output node Vo+), the limiting effect of $C_{gd}$ on transistor M5 may be canceled, or at least reduced. Similarly, by having an extra capacitive element on the gate node of NMOS transistor M6, whose other terminal is connected with a signal net (output node Vo+) that moves complementary to the drain node of transistor M6 (also output node Vo−), the limiting effect of $C_{gd}$ on transistor M6 may be canceled, or at least reduced. The cross-coupled capacitive elements extend the range over which the active inductor load circuit 510 behaves inductively and increase the Q of each active inductor. Therefore, the achievable inductive peaking of the circuit 510 is significantly increased, which leads to providing larger signal swing across the circuit 510 for a given power or, alternatively, lower power for a given signal swing.

For some examples, NMOS transistors M7 and M8 may be the same type and have the same architecture and dimensions as the NMOS transistors M5 and M6. In this manner, the cancellation of the effects of $C_{gd}$ may track well across PVT.

Example Operations for Distributing a Periodic Signal

Figure 6:
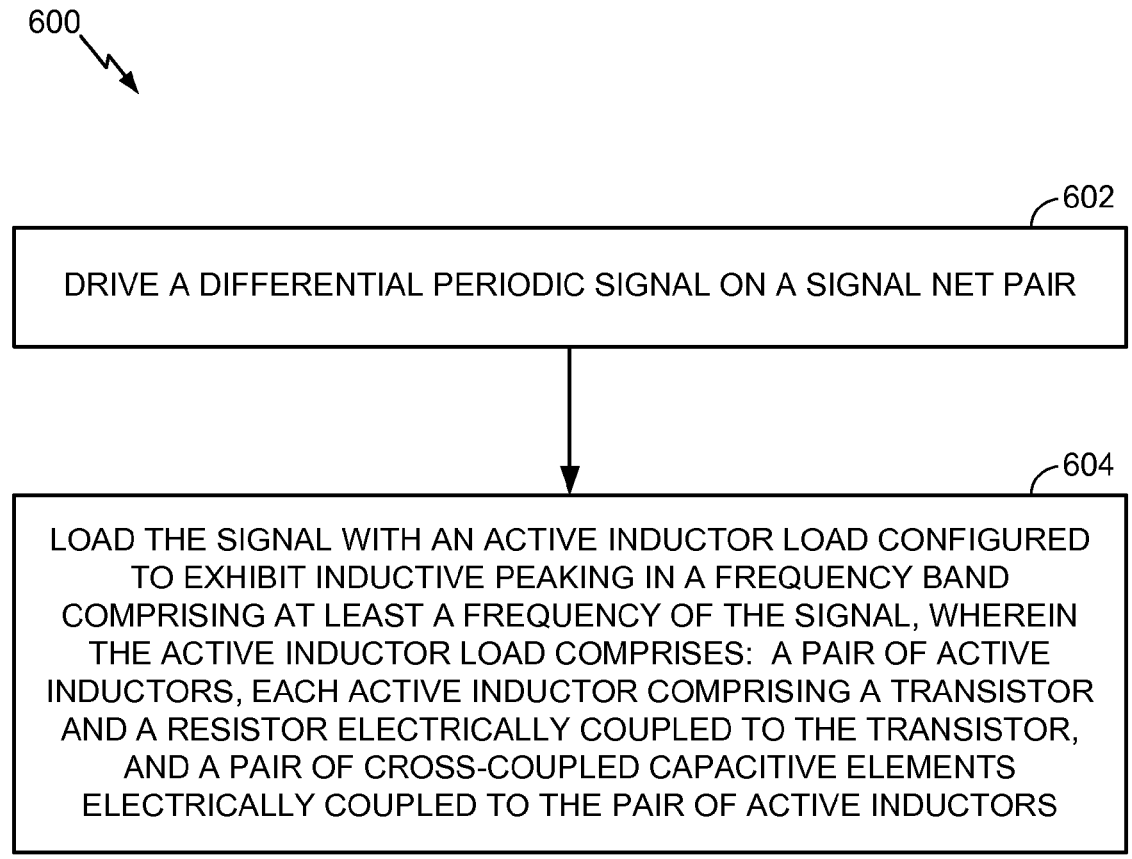
FIG. 6 is a flow diagram of example operations for distributing a periodic signal, in accordance with an example of the present disclosure.

FIG. 6 is a flow diagram of example operations 600 for distributing a periodic signal, in accordance with an example of the present disclosure. The operations 600 may be performed, for example, by an apparatus having a driving circuit coupled to a signal net pair terminated by an active inductor load (e.g., the circuit 210 of FIG. 2B). One example apparatus is a programmable IC with a clock distribution system, such as an FPGA implementing the architecture 100 of FIG. 1 with the configuration, clock, and other control logic (CONFIG/CLOCKS 105) and/or the vertical areas 109 to distribute the clock signals throughout the FPGA.

The operations 600 may begin, at block 602, with the apparatus driving a differential periodic signal (e.g., a clock signal) on a signal net pair (e.g., signal nets 216 and 217). At block 604, the apparatus may load the differential periodic signal with an active inductor load configured to exhibit inductive peaking in a frequency band comprising at least a frequency of the differential periodic signal. The active inductor load generally includes a pair of active inductors, each active inductor having a transistor and a resistor electrically coupled to the transistor, and a pair of cross-coupled capacitive elements electrically coupled to the pair of active inductors.

According to some examples, the driving at block 602 involves driving the differential periodic signal with a differential current mode logic (CML) buffer or a differential CML multiplexer (mux).

According to some examples, the pair of active inductors include first and second transistors, and the pair of cross-coupled capacitive elements include first and second capacitive elements. In this case, the first capacitive element may be electrically coupled between a gate of the first transistor and a drain of the second transistor, and the second capacitive element may be electrically coupled between a gate of the second transistor and a drain of the first transistor. For some examples, the first capacitive element comprises a third transistor. In this case, a drain of the third transistor may be shorted to a source of the third transistor, a gate of the third transistor may be electrically coupled to the gate of the first transistor, and at least one of the source or the drain of the third transistor may be electrically coupled to the drain of the second transistor. For some examples, the second capacitive element comprises a fourth transistor. In this case, a drain of the fourth transistor may be shorted to a source of the fourth transistor, a gate of the fourth transistor may be electrically coupled to the gate of the second transistor, and at least one of the source or the drain of the fourth transistor is electrically coupled to the drain of the first transistor. For some examples, the first, second, third, and fourth transistors are NMOS transistors, while in other example, the first, second, third, and fourth transistors are PMOS transistors. For some examples, a junction capacitance of the third transistor is approximately equal to a gate-to-drain capacitance of the first transistor, and a junction capacitance of the fourth transistor is approximately equal to a gate-to-drain capacitance of the second transistor.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A method of distributing one or more periodic signals in a programmable integrated circuit (IC), comprising:
    driving the one or more periodic signals on a plurality of signal net pairs routed throughout the programmable IC and coupled to a plurality of configurable logic blocks in the programmable IC; and
    loading a differential periodic signal in the one or more periodic signals with an active inductor load configured to exhibit inductive peaking in a frequency band comprising at least a frequency of the differential periodic signal, wherein the active inductor load comprises:
        a pair of active inductors, each active inductor comprising a transistor and a resistor electrically coupled to the transistor; and
        a pair of cross-coupled capacitive elements electrically coupled to the pair of active inductors.

2. The method of claim 1, wherein the driving comprises driving the one or more periodic signals with one or more differential current mode logic (CML) buffers.

3. The method of claim 1, wherein the driving comprises driving the one or more periodic signals with one or more differential current mode logic (CML) multiplexers (muxes).

4. The method of claim 1, wherein:
    the pair of active inductors comprise first and second transistors;
    the pair of cross-coupled capacitive elements comprise first and second capacitive elements;
    the first capacitive element is electrically coupled between a gate of the first transistor and a drain of the second transistor; and
    the second capacitive element is electrically coupled between a gate of the second transistor and a drain of the first transistor.

5. The method of claim 4, wherein:
    the first capacitive element comprises a third transistor;
    a drain of the third transistor is shorted to a source of the third transistor;
    a gate of the third transistor is electrically coupled to the gate of the first transistor; and
    at least one of the source or the drain of the third transistor is electrically coupled to the drain of the second transistor.

6. The method of claim 5, wherein:
    the second capacitive element comprises a fourth transistor;
    a drain of the fourth transistor is shorted to a source of the fourth transistor;
    a gate of the fourth transistor is electrically coupled to the gate of the second transistor; and
    at least one of the source or the drain of the fourth transistor is electrically coupled to the drain of the first transistor.

7. The method of claim 6, wherein the first, second, third, and fourth transistors are n-channel metal-oxide semiconductor (NMOS) transistors.

8. The method of claim 1, wherein:
    the resistor in each active inductor is electrically coupled between a gate and a drain of the transistor in each active inductor; and
    a resistance of the resistor in each active inductor is greater than an inverse of a transconductance of the transistor in each active inductor.

9. A programmable integrated circuit (IC) comprising:
    a plurality of configurable logic blocks; and
    a clock distribution system coupled to the plurality of configurable logic blocks via a plurality of signal net pairs and configured to distribute one or more periodic signals throughout the programmable IC via the plurality of signal net pairs, wherein at least one of the signal net pairs is terminated with an active inductor load comprising:
        a pair of active inductors, each active inductor comprising a transistor and a resistor electrically coupled between a gate and a drain of the transistor, wherein a resistance of the resistor in each active inductor is greater than an inverse of a transconductance of the transistor in each active inductor; and
        a pair of cross-coupled capacitive elements electrically coupled to the pair of active inductors.

10. The programmable IC of claim 9, wherein the transistor in each active inductor comprises a fin field-effect transistor (FinFET).

11. The programmable IC of claim 9, wherein:
the pair of active inductors comprise first and second transistors;
the pair of cross-coupled capacitive elements comprise first and second capacitive elements;
the first capacitive element is electrically coupled between a gate of the first transistor and a drain of the second transistor; and
the second capacitive element is electrically coupled between a gate of the second transistor and a drain of the first transistor.

12. The programmable IC of claim 11, wherein:
the first capacitive element comprises a third transistor;
a drain of the third transistor is shorted to a source of the third transistor;
a gate of the third transistor is electrically coupled to the gate of the first transistor; and
at least one of the source or the drain of the third transistor is electrically coupled to the drain of the second transistor.

13. The programmable IC of claim 12, wherein:
the second capacitive element comprises a fourth transistor;
a drain of the fourth transistor is shorted to a source of the fourth transistor;
a gate of the fourth transistor is electrically coupled to the gate of the second transistor; and
at least one of the source or the drain of the fourth transistor is electrically coupled to the drain of the first transistor.

14. The programmable IC of claim 13, wherein the third and fourth transistors are the same type and have the same architecture and dimensions as the first and second transistors.

15. The programmable IC of claim 13, wherein the first, second, third, and fourth transistors are p-channel metal-oxide semiconductor (PMOS) transistors.

16. The programmable IC of claim 13, wherein:
a junction capacitance of the third transistor is approximately equal to a gate-to-drain capacitance of the first transistor; and
a junction capacitance of the fourth transistor is approximately equal to a gate-to-drain capacitance of the second transistor.

17. The programmable IC of claim 11, wherein a source of the first transistor and a source of the second transistor are electrically coupled to a reference potential.

18. The programmable IC of claim 11, wherein the drain of the first transistor and the drain of the second transistor are electrically coupled to the at least one of the signal net pairs.

19. The programmable IC of claim 9, wherein each active inductor is configured to exhibit inductive peaking in a frequency band comprising at least a frequency of a differential periodic signal in the one or more periodic signals, the differential periodic signal to be applied to the pair of active inductors.

20. The programmable IC of claim 9, wherein an impedance of each active inductor is configured to increase with frequency over a frequency range, based on the resistance of the resistor in each active inductor being greater than the inverse of the transconductance of the transistor in each active inductor.

* * * * *